US008884495B2

(12) United States Patent
Matsuo et al.

(10) Patent No.: US 8,884,495 B2
(45) Date of Patent: Nov. 11, 2014

(54) PIEZOELECTRIC SENSOR

(75) Inventors: Yasuhide Matsuo, Sakado (JP); Daisuke Shimizu, Sakado (JP)

(73) Assignee: Tamura Corporation, Tokyo (JP)

(*) Notice: Subject to any disclaimer, the term of this patent is extended or adjusted under 35 U.S.C. 154(b) by 188 days.

(21) Appl. No.: 13/355,116

(22) Filed: Jan. 20, 2012

(65) Prior Publication Data

US 2012/0187801 A1 Jul. 26, 2012

(30) Foreign Application Priority Data

Jan. 24, 2011 (JP) ................................ 2011-011815

(51) Int. Cl.

*H01L 41/053* (2006.01)
*G10K 11/00* (2006.01)
*H01L 41/08* (2006.01)

(52) U.S. Cl.

CPC .............. *G10K 11/004* (2013.01); *H01L 41/08* (2013.01)
USPC ............ 310/334; 310/338; 310/348; 310/352

(58) Field of Classification Search

CPC ......... G10K 11/02; G10K 11/30; H04R 17/00
USPC ................................. 310/334, 338, 348, 335
See application file for complete search history.

(56) References Cited

U.S. PATENT DOCUMENTS

| | | | | |
|---|---|---|---|---|
| 5,802,196 | A * | 9/1998 | Nakamura | 381/423 |
| 5,889,351 | A * | 3/1999 | Okumura et al. | 310/321 |
| 6,087,760 | A * | 7/2000 | Yamaguchi et al. | 310/334 |
| 7,554,248 | B2 * | 6/2009 | Oda et al. | 310/348 |
| 2008/0309199 | A1 * | 12/2008 | Furukawa | 310/334 |

FOREIGN PATENT DOCUMENTS

| | | | |
|---|---|---|---|
| CN | 102136546 | | 7/2011 |
| EP | 1199906 | * | 4/2002 |
| JP | 47-36765 | | 9/1972 |
| JP | 55-51568 | | 4/1980 |
| JP | 58-88500 | | 6/1983 |
| JP | 61-64798 | | 5/1986 |
| JP | 6-38399 | | 5/1994 |
| JP | 2002-044784 | | 2/2002 |

OTHER PUBLICATIONS

Japanese Application No. 2011-011815 Office Action dated Jun. 11, 2013, 3 pages including English translation.
Japanese Application No. 2011-011815 Office Action dated Jan. 8, 2013, 4 pages including English translation.
Chinese Application No. 201210015812.4 Office Action dated Jul. 9, 2014, 9 pages with English translation.

* cited by examiner

*Primary Examiner* — Derek Rosenau
*Assistant Examiner* — Bryan Gordon

(57) ABSTRACT

The present invention provides a piezoelectric sensor that can reduce spurious vibration of a transducer. The piezoelectric sensor includes a transducer which has a piezoelectric body and a vibration plate and which transmits/receives ultrasound, and a mount supporting the transducer near nodes of mechanical vibration generated to the transducer. The mount includes ribs that contact the transducer near the nodes of vibration in a point by point, line by line or partially plane by plane contact manner to support the transducer, and retract portions which are provided side by side to respective ribs near the nodes of vibration and which are distant from the transducer so as not to support the transducer.

14 Claims, 6 Drawing Sheets

PIEZOELECTRIC SENSOR

CROSS-REFERENCE TO RELATED APPLICATION(S)

This application is based upon and claims the benefit of priority from Japanese Patent Application No. 2011-011815, filed Jan. 24, 2011; the entire contents of which are incorporated herein by reference.

FIELD OF THE INVENTION

The present invention relates to a piezoelectric sensor that can transmit and receive ultrasound through a mechanical vibration of a piezoelectric body.

BACKGROUND

Such piezoelectric sensors are non-contact type detection sensors which can be used as detectors of automatic doors, etc., and which use ultrasound as detection media. More specifically, a piezoelectric sensor includes a piezoelectric body that mutually converts mechanical energy into electric energy and vice versa. Such functions are so-called a piezoelectric effect and an inverse piezoelectric effect. For example, when a voltage is applied, a piezoelectric body expands and contracts.

JP55-51568 A discloses a structure of a transducer with a combination of a piezoelectric body and a vibration plate. More specifically, a transducer including a piezoelectric body and a vibration plate is disposed on a mount that holds terminals. Electrical continuity is given between the transducer and the terminals by conductive wires. When a voltage is applied to the piezoelectric body through the terminals and the conductive wires, the transducer is inflected together with expansion and contraction of the piezoelectric body, and such an inflection motion generates mechanical vibration (which is referred to as a resonance phenomenon). Hence, the piezoelectric sensor becomes able to transmit ultrasound.

The transmitted ultrasound is reflected by an object, and when the piezoelectric sensor receives the reflected ultrasound, the transducer is inflected. The transducer obtains a voltage upon generation of a piezoelectric effect in response to the inflection. Hence, the piezoelectric sensor is capable of detecting presence/absence of an object approaching a door and a distance to the object, and thus the control unit of an automatic door can output a drive signal to a motor for opening/closing the door.

Meanwhile, according to the transducer of the prior art, the node of such mechanical vibration is supported by the mount, and the whole nodes of such mechanical vibration contact the mount. More specifically, the mount is provided with a cylindrical rib protruding toward the transducer, and the tip surface of this annularly closed rib supports the transducer. Further, a cylindrical bonding part is formed at the inner circumference of the rib, and the transducer is fixed by a bond at the nodes of vibration.

According to such a structure, however, unnecessary vibration so-called spurious vibration is generated to the transducer. That is, even if the mount contacts the transducer through nodes where amplitude becomes zero, when the contact area between the mount and the transducer is large, the mount disturbs vibration of the transducer. As a result, spurious vibration is generated and deteriorates the vibration performance of the transducer.

According to the structure that simply supports the transducer by the cylindrical rib and the bonding parts, no special consideration is given to the generation of spurious vibration, and any measures for reducing the spurious vibration become necessary. Moreover, there is a technique which fixes the mount to the transducer by a bond in a non-contact manner. However this needs a jig, etc., for suspending the transducer, thereby making the production of the piezoelectric sensor difficult. Hence, it is an object of the present invention to provide a piezoelectric sensor which can address the above-explained problem and which can reduce the spurious vibration of a transducer.

SUMMARY OF THE INVENTION

To achieve the object, a first aspect of the present invention provides a piezoelectric sensor that includes: a transducer which includes a piezoelectric body and a vibration plate and which transmits/receives ultrasound; and a mount that supports the transducer near nodes of mechanical vibration generated to the transducer, the mount comprising ribs that contact the transducer near nodes of mechanical vibration in a point by point, line by line or partially plane by plane contact manner to support the transducer.

According to the first aspect of the present invention, the piezoelectric sensor has the transducer that includes the piezoelectric body and the vibration plate, and the transducer can transmit/receive ultrasound. The transducer is supported by the mount near nodes of mechanical vibration, and the mount has the ribs that contact the transducer in a point by point, line by line or a partially plane by plane contact manner to support the transducer. As such, the contact area between the mount and the transducer is reduced in comparison with the prior art, the mount does not disturb a vibration of the transducer, thereby reducing spurious vibration. This results in an improvement of the vibration performance of the transducer, and contributes to an improvement of the reliability of the piezoelectric sensor.

A second aspect of the present invention provides the piezoelectric sensor of the first aspect, in which the mount further comprises retract portions which are provided side by side to respective ribs near nodes of mechanical vibration and which are distant from the transducer so as not to support the transducer.

According to the second aspect of the present invention, in addition to the advantage of the first aspect of the present invention, the mount has the ribs and the retract portions, and the ribs contact the transducer in a point by point, line by line or a partially plane by plane contact manner to support the transducer. In contrast, the retract portions are provided near respective nodes of mechanical vibration of the transducer like the ribs, but do not contact the transducer so as not to support the transducer. Hence, the contact area between the mount and the transducer is surely reduced, thereby further reducing spurious vibration.

A third aspect of the present invention provides the piezoelectric sensor of the first and second aspect of the present invention, in which the ribs are disposed at three locations along a circumference of the mount at a substantially equal interval.

According to the third aspect of the present invention, in addition to the advantages of the first and second aspects, the ribs are disposed at the three locations with a substantially equal interval as viewed in a circumferential direction of the mount formed in a substantially columnar shape. Hence, even if the contact area with the transducer is reduced, the transducer can be stably supported. Moreover, when the intervals between respective ribs are uniform, it is easy to provide the ribs on the mount in comparison with a case in which the ribs are simply provided at three locations.

A fourth aspect of the present invention provides the piezoelectric sensor of the first to third aspects of the present invention, in which the ribs each have a tip surface which is formed in a flat shape and which contacts the transducer in a plane by plane contact manner.

According to the fourth aspect of the present invention, in addition to the advantages of the first to third aspects of the present invention, when the ribs contact the transducer in a partially plane by plane contact manner, if respective tip surfaces thereof are flat, a disturbance of a vibration of the transducer by the mount is further suppressed, thereby contributing an improvement of the vibration performance of the transducer.

A fifth aspect of the present invention provides the piezoelectric sensor of the first to fourth aspects of the present invention that further includes: a lead which is drawn from the transducer and which has an electrical continuity between the transducer and a terminal connected to a circuit board; and a case that has the mount on a surface opposite to a surface holding the terminal, in which the surface holding the terminal is provided with a spacer that ensures a space between this surface and the circuit board.

According to the fifth aspect of the present invention, in addition to the advantages of the first to fourth aspects of the present invention, a transmission of vibration from the case to the circuit board is avoidable, and damage to the circuit board and to the case by solders is suppressed.

As described above, according to the present invention, the contact area between the mount and the transducer is made small, and thus the piezoelectric sensor is provided which has the mount not disturbing vibration of the transducer, and which can reduce spurious vibration of the transducer.

DETAILED DESCRIPTION OF THE EMBODIMENTS

An embodiment of the present invention will be explained with reference to the accompanying drawings.

(Configuration)

Figure 1:
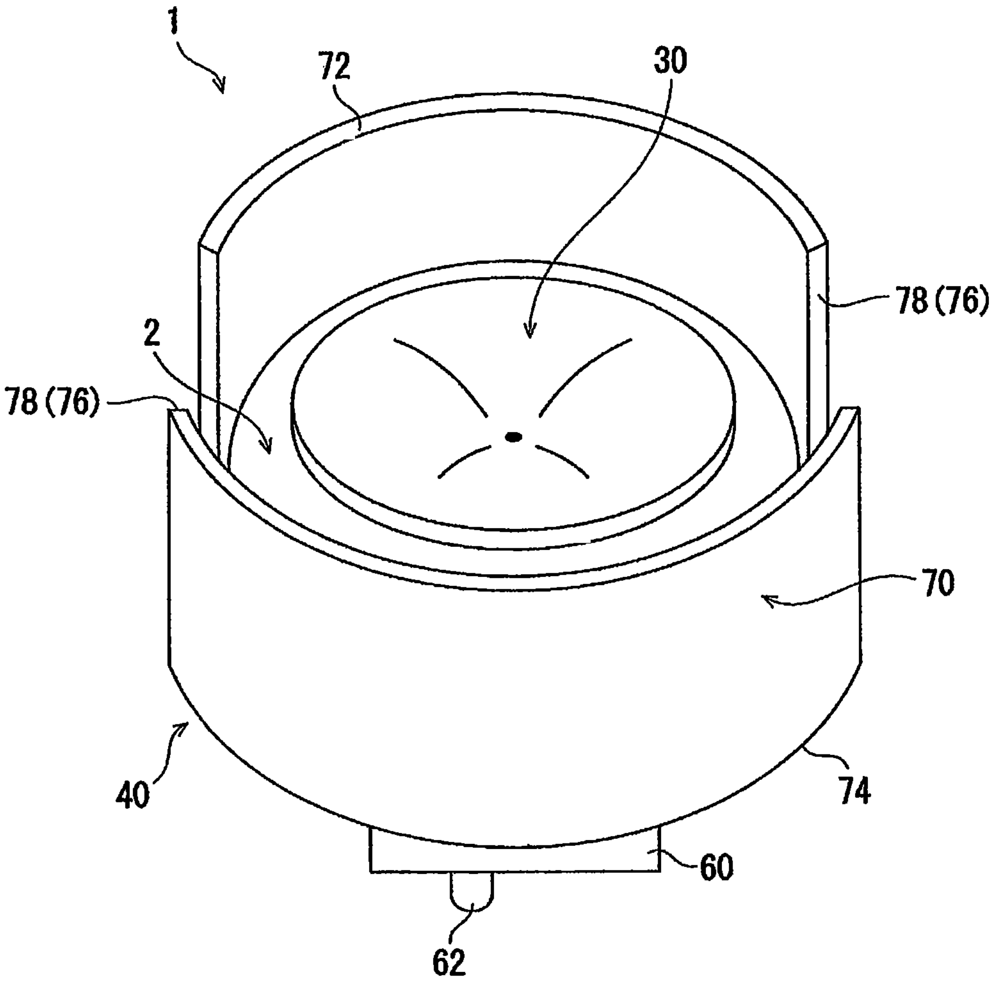
FIG. 1 is a perspective view showing an external appearance of a piezoelectric sensor according to an embodiment of the present invention.
Figure 2:
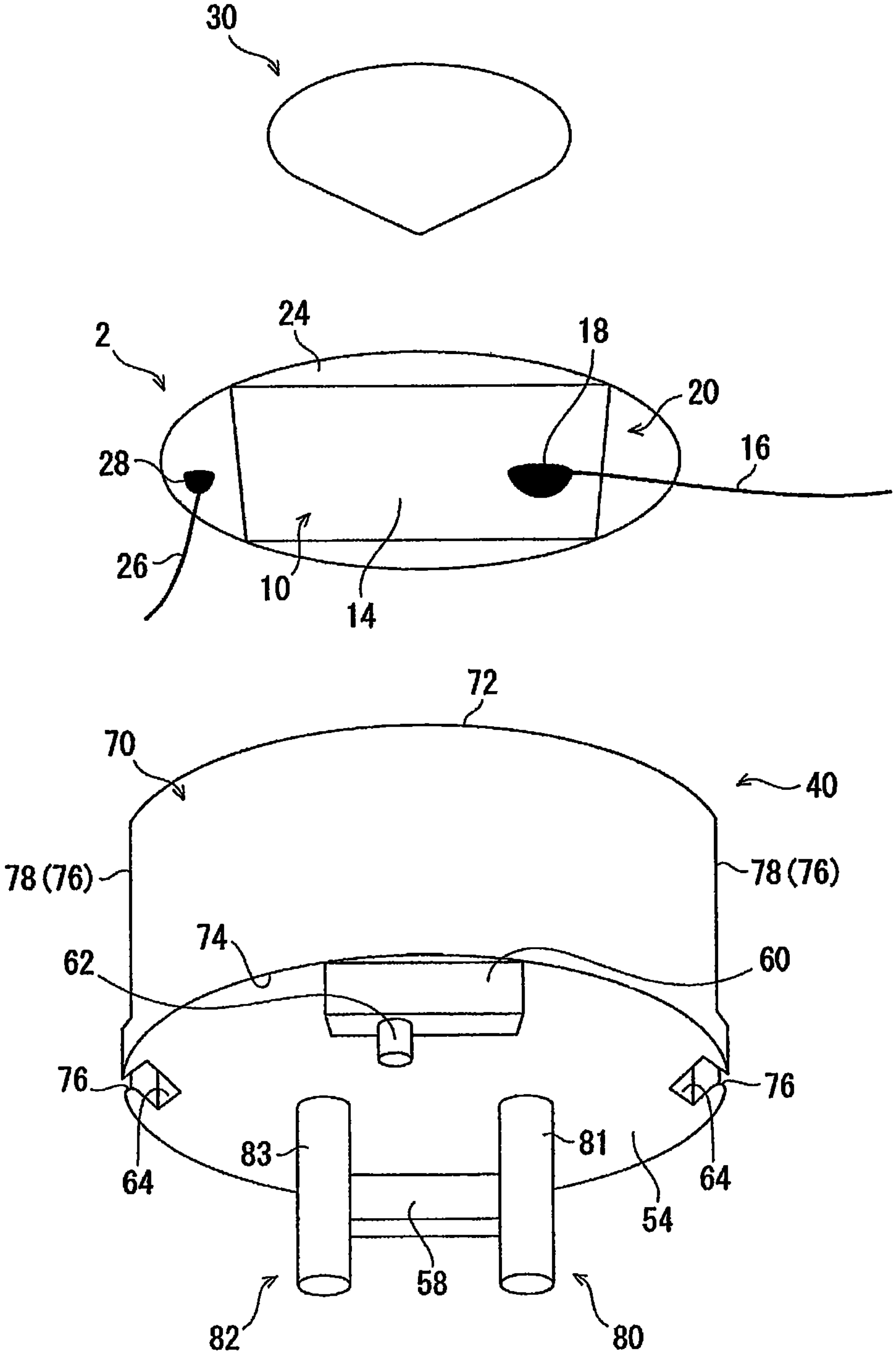
FIG. 2 is an exploded perspective view of the piezoelectric sensor of FIG. 1, and showing the piezoelectric sensor before assembled.

FIG. 1 is a perspective view showing an external appearance of a piezoelectric sensor 1 according to an embodiment as viewed from the top, and FIG. 2 is an exploded perspective view of the piezoelectric sensor 1 before assembled as viewed from the bottom. The piezoelectric sensor 1 is used as the detector of an automatic door, etc., and is a non-contact type detection sensor that uses ultrasound as detection media.

As shown in FIGS. 1 and 2, the piezoelectric sensor 1 mainly includes a transducer 2 and a case 40, and the transducer 2 is retained in the case 40. Respective bottoms of FIGS. 1 and 2 correspond to the bottom side of the case 40. The piezoelectric sensor 1 is mounted such that the bottom of the case 40 is faced to the mount surface of a circuit board of the above-explained detector. In the following explanation relating to the piezoelectric sensor 1, "the bottom side" indicates a side facing the mount surface, while the "upper side" is an opposite side thereof. A surface at the upper side is referred to as "a surface" or "a front face," while a surface at the bottom side is referred to as "another surface," "a rear face," or a "bottom face."

The transducer 2 of this embodiment employs a unimorph structure having a piezoelectric ceramic (a piezoelectric body) 10 superimposed on a metal vibration plate 20. More specifically, the piezoelectric ceramic 10 is formed of, for example, lead-zirconium-titanate-based ceramic (PZT), and has a predetermined thickness in the height direction (the vertical directions in FIGS. 1 and 2) of the case 40 (see FIG. 3). The piezoelectric ceramic 10 is not limited to any particular shape, but an example of such a shape is a substantially square plate.

Figure 3:
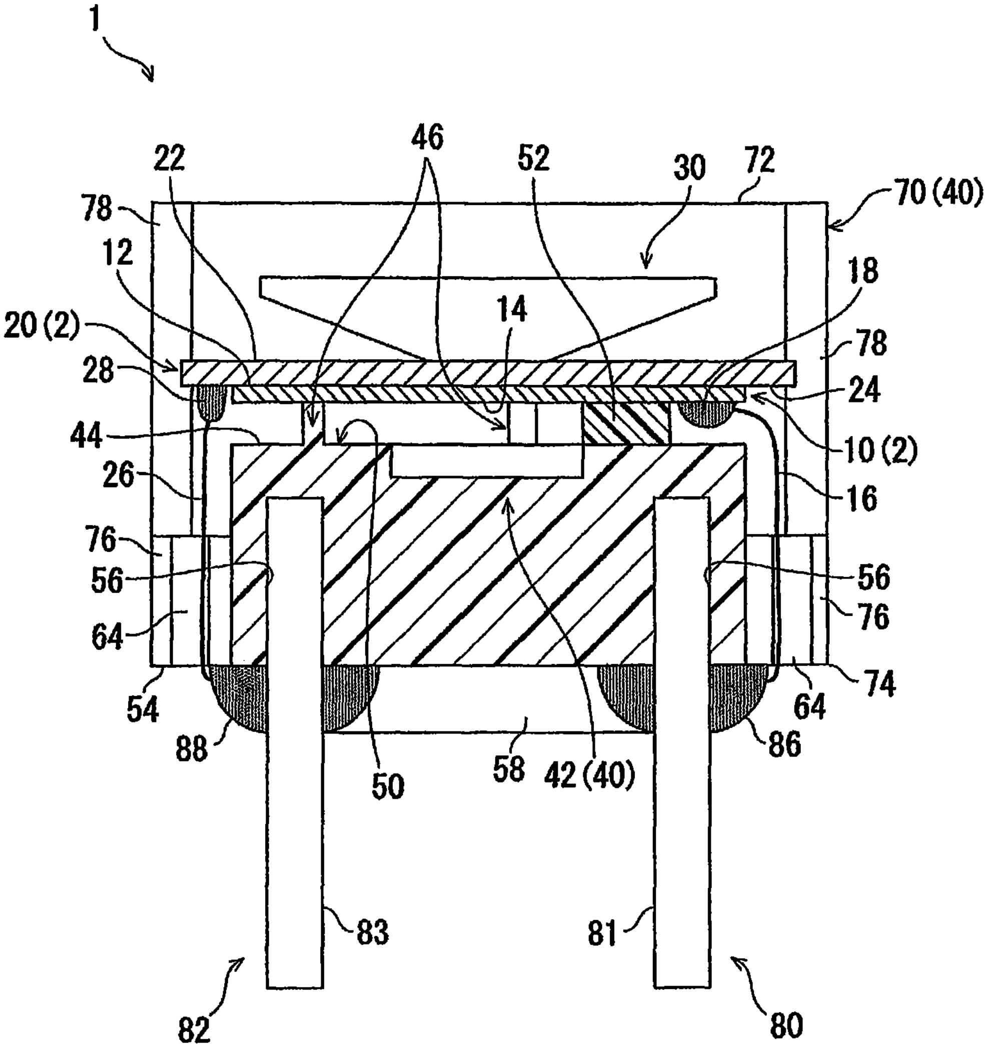
FIG. 3 is a vertical cross-sectional view of the piezoelectric sensor of FIG. 1.

As shown in FIGS. 2 and 3, a lead 16 is fastened to an appropriate position of another surface 14 of the piezoelectric ceramic 10 by a solder 18. The lead (conductive line) 16 of this embodiment is a copper wire, but a covered wire or a gold thread wire may be used. The vibration plate 20 is superimposed on the top of the piezoelectric ceramic 10. The vibration plate 20 also has a predetermined thickness in the height direction of the case 40, and is a circular plate (see FIG. 3). The vibration plate 20 has a dimension that allows the piezoelectric ceramic 10 to inscribe the vibration plate 20.

In order to generate large vibration by applying vibration of the piezoelectric ceramic 10 to the vibration plate 20, the piezoelectric ceramic 10 and the vibration plate 20 are superimposed together, and a rear face 24 of the vibration plate 20 and a surface 12 of the piezoelectric ceramic 10 are bonded together by a bond. In FIG. 3, in order to facilitate understanding for this structure, respective thicknesses of the piezoelectric ceramic 10 and the vibration plate 20 are drawn in an exaggerated manner.

A lead (conductive line) 26 is also fastened to an appropriate position of the rear face 24 of the vibration plate 20 by a solder 28 (see FIGS. 2 and 3). Like the lead 16, the lead 26 is a copper wire, a covered wire or a gold thread wire. Furthermore, a metal horn 30 is disposed on a front face 22 of the vibration plate 20 (see FIG. 3). The horn 30 is in a corn shape, and increases diameter as becoming apart from the vibration plate 20. The lower part of the horn 30 with a decreased diameter is bonded to a substantial center of the front face 22 of the vibration plate 20. Note that a diameter increased surface of the horn 30 shown in FIG. 1 has a predetermined coating.

Figure 4:
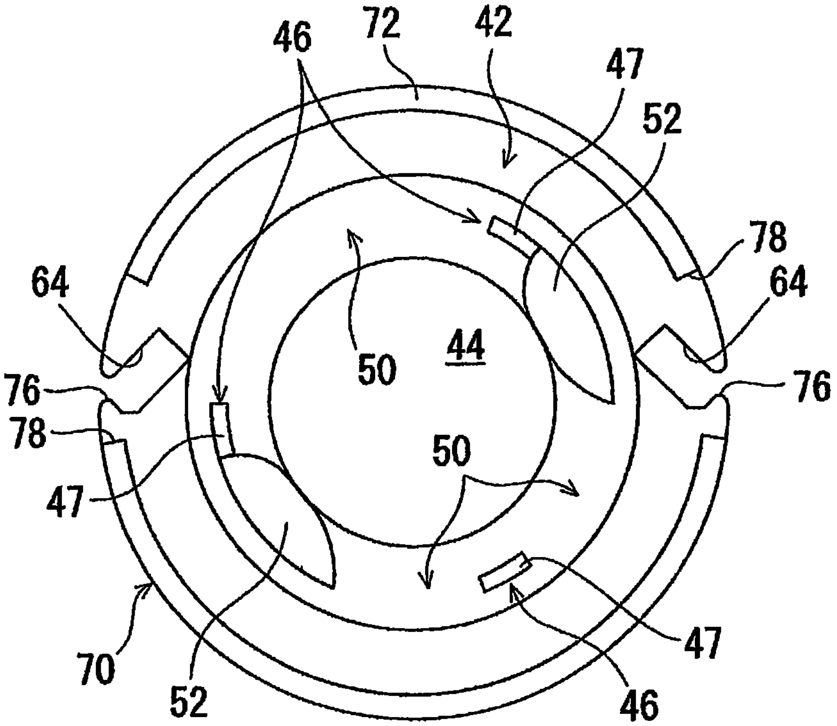
FIG. 4 is a plan view of a case shown in FIG. 2.

The case 40 of this embodiment is made of a plastic resin and is in a cup shape. The bottom part of the cup serves as a mount 42 that is formed together with a peripheral wall 70 having openings. More specifically, as shown in FIG. 3 and FIG. 4 that is a plan view of the case 40 in FIG. 2, the mount 42 is formed in a substantially columnar shape, and has a top face 44 that supports the transducer 2.

The top face 44 is provided with a total of three supports 46, that are ribs, protruding toward the transducer 2 according to this embodiment. More specifically, as shown in FIG. 4, the supports 46 are disposed at three locations. Respective supports 46 are distant from one another at a substantially equal interval that is a center angle of 120 degrees as viewed in a circumferential direction of the mount 42. Each support 46 has a tip surface 47 that is a small flat area. Another surface 14 of the piezoelectric ceramic 10 contacts respective tip surfaces 47 of the supports 46 in a plane by plane contact manner.

The supports 46 are formed integrally with the top face 44 according to this embodiment (see FIG. 3), but may be formed separately from the top face 44.

When the mount 42 and the supports 46 are considered as an integral piece, it can be thought that portions between respective supports 46 are cut out and three notches 50, that are retract portions, are provided on the top face 44. The notches 50 have a shorter height than those of the supports 46 and disposed on a circular trajectory passing through all supports 46. More specifically, as shown in FIG. 4, the notches each 50 are arranged between the three supports 46. As a result, a large space is formed between the supports 46 respectively. The notches 50 are positioned apart from another surface 14 of the piezoelectric ceramic 10, and do not contact another surface 14.

As shown in FIG. 4, a bonding portion 52 is formed in the notch 50 (see FIG. 4). Another surface 14 of the piezoelectric ceramic 10 is bonded to respective bonding portions 52 by a bond and supported by such bonding portions 52. The bonding portion 52 is formed in some of the notches 50 (e.g., two locations) so as to adjoin the support 46. The two bonding portions 52 have a substantially symmetrical positional, relationship relative to the center line of the mount 42 according to this embodiment. Moreover, those bonding portions 52 extend towards inner peripheral side the mount 42 from the space between the supports 46, and contact the transducer 2 at the two locations in a plane by plane contact manner.

More specifically, the bonding portions 52 are formed at nodes of mechanical vibration generated to the transducer 2. A node of mechanical vibration is a position where amplitude becomes zero. The transducer 2 of this embodiment is in a circular shape, is inflected together with expansion and contraction of the substantially square piezoelectric ceramic 10 in the width direction and the lengthwise direction, and is driven by a voltage with the unique resonant frequency of such vibration. In this case, the node of vibration locates at a position close to the center by $\phi/4$ from a circumference of the circle with a diameter $\phi$. That is to say, the node of vibration locates at a position on circumference of the circle with a diameter substantially $\phi/2$ relative to the center of the transducer 2. Hence, according to this embodiment, the bonding portion 52 partially supports a position close to the center by $\phi/4$ from a circumference of the circle with a diameter $\phi$ of the transducer 2. Note that also in the thickness direction, expansion and contraction of the piezoelectric ceramic 10 are generated, although those are smaller than expansion and contraction in the width direction and the lengthwise direction.

In view of this, the mount 42 has a lower face 54 facing the mount surface of the above-explained circuit board. As shown in FIG. 3, the lower face 54 has terminal holders 56, 56 formed at appropriate positions thereof. The terminal holders 56, 56 protrude toward the mount surface while holding terminals 80 and 82 having a substantially circular cross-section. There is no problem if the shapes of the terminals 80 and 82 are in a rectangular cross-sectional shape.

Spacers 58 and 60 are provided near the circumference of the lower face 54 (see FIGS. 2 and 5). The spacers 58 and 60 are each a substantially rectangular cuboid, has a lengthwise direction running along the lower face 54. The pair of spacers 58 and 60 are disposed at symmetrical positions relative to the center of the lower face 54 and are capable of abutting the mount surface. The spacers 58 and 60 ensure a space between the lower face 54 and the mount surface, thereby protecting the case 40 and the circuit board. Accordingly, the lower face 54 does not contact the circuit board, and thus transmission of vibration can be suppressed from the case 40 to the circuit board. Moreover, when the leads 16 and 26 are fastened to the terminals 80 and 82, respectively, by the solders 86 and 88 like this embodiment, the solders 86 and 88 can be spaced apart from the circuit board by the spacers 58 and 60. Furthermore, when the terminals 80 and 82 are fixed to the circuit board by solders, the spacers 58 and 60 allow such solders to be spaced apart from the lower face 54, thereby suppressing a melting of the resin-made case 40.

Figure 5A:
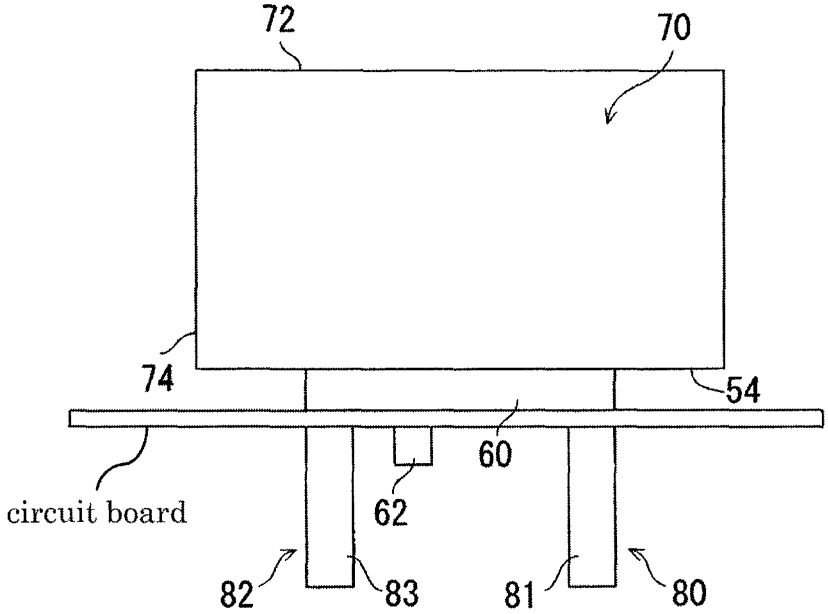
FIG. 5A is a side view of the case shown in FIG. 2.
Figure 5B:
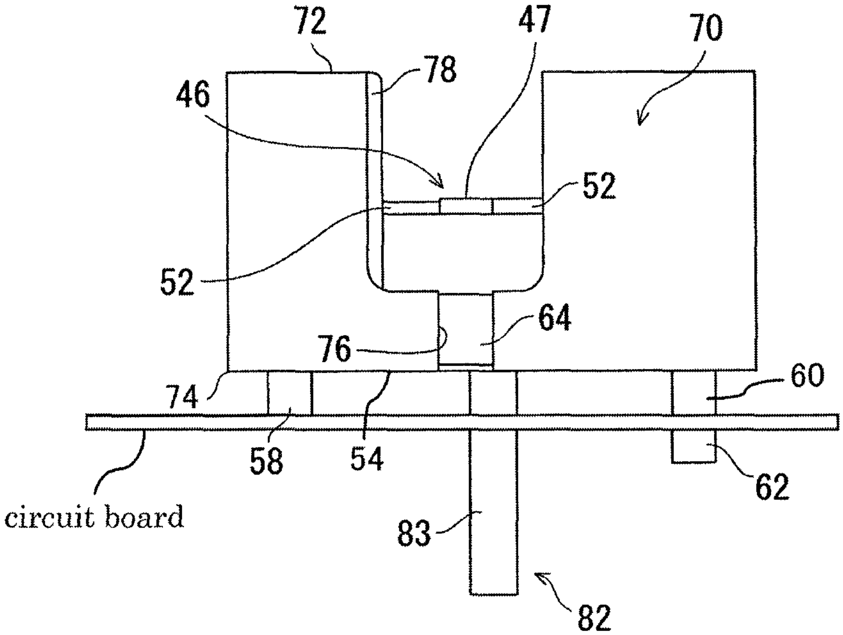
FIG. 5B is a side view of the case shown in FIG. 2.

FIG. 5A is a side view of the case 40 as viewed from the bottom side of FIG. 4. FIG. 5B is a side view of the case 40 as viewed from the left side of FIG. 5A. From those figures, the following portions are illustrated: the support 46 located at left side of FIG. 4; the bonding portion 52 also located at left side of FIG. 4 below the support 46 (in FIG. 5B, located at the right side of the support 46); and the bonding portion 52 located at the right side of FIG. 4 (in FIG. 5B, located at the left side of the support 46 in FIG. 5B).

One of the spacer 60 among the spacers 58 and 60 is provided with a pin 62 in a protruding manner for identifying the polarities of the terminals 80 and 82. The pin 62 of this embodiment is provided on the spacer 60, but may be provided on the lower face 54.

Furthermore, the mount 42 of this embodiment has protective portions 64, 64 near the circumference thereof (see FIG. 4). More specifically, the protective portions 64, 64 are each a hole passing all the way through from the lower face 54 to the mount 42 in the height direction of the case 40 and reaching the interior of the case 40. The protective portion 64 has a substantially rectangular cross-section which is perpendicular to the height direction of the case 40. The longer side of this rectangular cross-section does not extend toward the center of the top face 44 and that of the lower face 54, but extend toward, for example, another spacer 58 among the spacers 58 and 60 in an inclined direction relative to the radial direction of the mount 42 (see FIGS. 2 and 4). The leads 16 and 26 are hooked in these protective portions 64, 64 and held thereby.

Next, the peripheral wall 70 stands from the circumference of the mount 42 and extends upwardly. More specifically, as shown in FIGS. 3 to 5, the peripheral wall 70 of this embodiment has a bottom end 74 located at substantially same height as that of the lower face 54 of the mount 42, and extends upwardly from the bottom end 74. The peripheral wall 70 further extends upwardly so as to cover around the top face 44 of the mount 42, and respective sides of the transducer 2 and the horn 30, and has an upper opening 72 at the top end thereof.

The peripheral wall 70 has a portion where the internal side of the peripheral wall 70 and the external side thereof are completely communicated with each other across the height direction of the case 40. More specifically, the peripheral wall 70 of this embodiment has lead-receiving openings 76, 76 (see FIG. 2). The lead-receiving openings 76, 76 are provided at positions corresponding to the protective portions 64, 64, respectively (see FIGS. 3 to 5), have a width that allows retention of at least individual leads 16, 26 thereinside, and pass all the way through the peripheral wall 70 between the internal side and the external side thereof from the upper opening 72 to the bottom end 74.

The lead receiving opening 76 is continuous from the corner part of the protective portion 64 closest to the circumference of the lower face 54 at a position facing the mount 42 (see FIGS. 3 and 4), and the protective portion 64 is communicated with the external side of the peripheral wall 70 through the lead receiving opening 76. Furthermore, the lead receiving openings 76, 76 of this embodiment have horn windows 78, 78, respectively, at positions facing the transducer 2 and the horn 30.

The horn windows 78, 78 are opened with a sufficiently wider width than the width which can retain individual leads 16 and 26, and are formed in a range across the narrow portions of the lead receiving openings 76 in the circumferential direction of the peripheral wall 70 (see FIGS. 4 and 5B).

(Assembling)

Returning to FIG. 2 again, the assembling of the piezoelectric sensor 1 will be explained. First, the case 40 holding the terminals 80 and 82 is prepared. The transducer 2 with the leads 16 and 26 is descended toward the mount 42. At this time, the leads 16 and 26 are retained in the wide portions of the lead receiving openings 76, 76, respectively, located at the upper opening 72, i.e., the horn windows 78, 78. The leads 16 and 26 are drawn from respective horn windows 78, 78 to the external side of the peripheral wall 70. Subsequently, the transducer 2 is descended toward the top face 44, and another surface 14 of the transducer 2 is caused to contact only respective supports 46. The transducer 2 is bonded at the two bonding portions 52, and thus fixed.

Next, the lead 16 drawn to the external side of the peripheral wall 70 through the horn window 78 is pinched by and drawn in the protective portion 64 from the narrow portion of the nearby lead receiving opening 76. Accordingly, as shown in FIG. 3, the side part of the lead 16 is held by the internal wall of the protective portion 64, and the tip of the lead 16 is drawn downwardly of the lower face 54.

The lead 26 drawn to the external side of the peripheral wall 70 through the horn window 78 is drawn in the protective portion 64 from the narrow portion of the nearby lead receiving opening 76. Accordingly, the side part of the lead 26 is held by the internal wall of the protective portion 64, and the tip of the lead 26 is drawn downwardly from the lower face 54 (see FIG. 3). The lead 16 is wound around a periphery 81 of the terminal 80 near the lower face 54 and is fixed by a solder 86. Moreover, the lead 26 is also wound around a periphery 83 of the terminal 82 near the lower face 54, and is fixed by a solder 88. Hence, electrical continuity between the transducer 2 and the terminals 80 and 82 is established.

Thereafter, the piezoelectric sensor 1 is finished when the horn 30 is bonded to a surface 22 of the vibration plate 20. The piezoelectric sensor 1 having the above-explained structure can transmit and receive ultrasound. The spacers 58 and 60 are mounted on the mount surface of the circuit board of the detector, and the terminals 80 and 82 are electrically connected to the circuit portion of the detector.

(Operation)

When a voltage is applied to the piezoelectric ceramic 10 through the terminals 80 and 82 and the leads 16 and 26, the piezoelectric ceramic 10 expands and contracts due to the inverse piezoelectric effect in the thickness direction and the width direction and the lengthwise direction both orthogonal to the thickness direction. The expansion and contraction of the piezoelectric ceramic 10 in the width direction and the lengthwise direction generate force that makes the whole transducer 2 flex, and mechanical vibration originating from the inflection motion of the transducer 2 generates ultrasound. The generated ultrasound is amplified by the horn 30. As explained above, the piezoelectric sensor 1 converts electrical signals into ultrasound, and can transmit the ultrasound toward an object from the upper opening 72.

This transmitted ultrasound propagates the air, and reflects toward the piezoelectric sensor 1 when collided with the object. The piezoelectric sensor 1 can convert the received ultrasound into electrical signals. More specifically, when the piezoelectric sensor 1 receives the reflected ultrasound through the horn 30, the piezoelectric ceramic 10 expands and contracts together with the inflection motion of the transducer 2, and a voltage is obtained by a piezoelectric effect.

As explained above, the piezoelectric sensor 1 can transmit and receive ultrasound through the piezoelectric effect and the inverse piezoelectric effect. The control unit of an automatic door 1 using the piezoelectric sensor 1 can detect presence/absence of an object approaching the door and a distance to the object, and becomes able to output a drive signal to a motor for opening/closing the door.

(Effect)

As explained above, according to this embodiment, the piezoelectric sensor 1 includes the unimorph transducer 2 configured by the piezoelectric ceramic 10 and the vibration plate 20, and the transducer 2 can transmit and receive ultrasound. The transducer 2 is supported by the mount 42 near the nodes of mechanical vibration of the transducer 2, but the mount 42 has the supports 46 that partially contact the transducer 2 in a plane by plane contact manner to support the transducer 2. When the contact area between the mount 42 and the transducer 2 is small in this manner in comparison with the prior art, the mount 42 does not disturb vibration of the transducer 2, thereby reducing spurious vibration. This results in the improvement of the vibration performance of the transducer 2, and contributes to the improvement of the reliability of the piezoelectric sensor 1.

Figure 6:
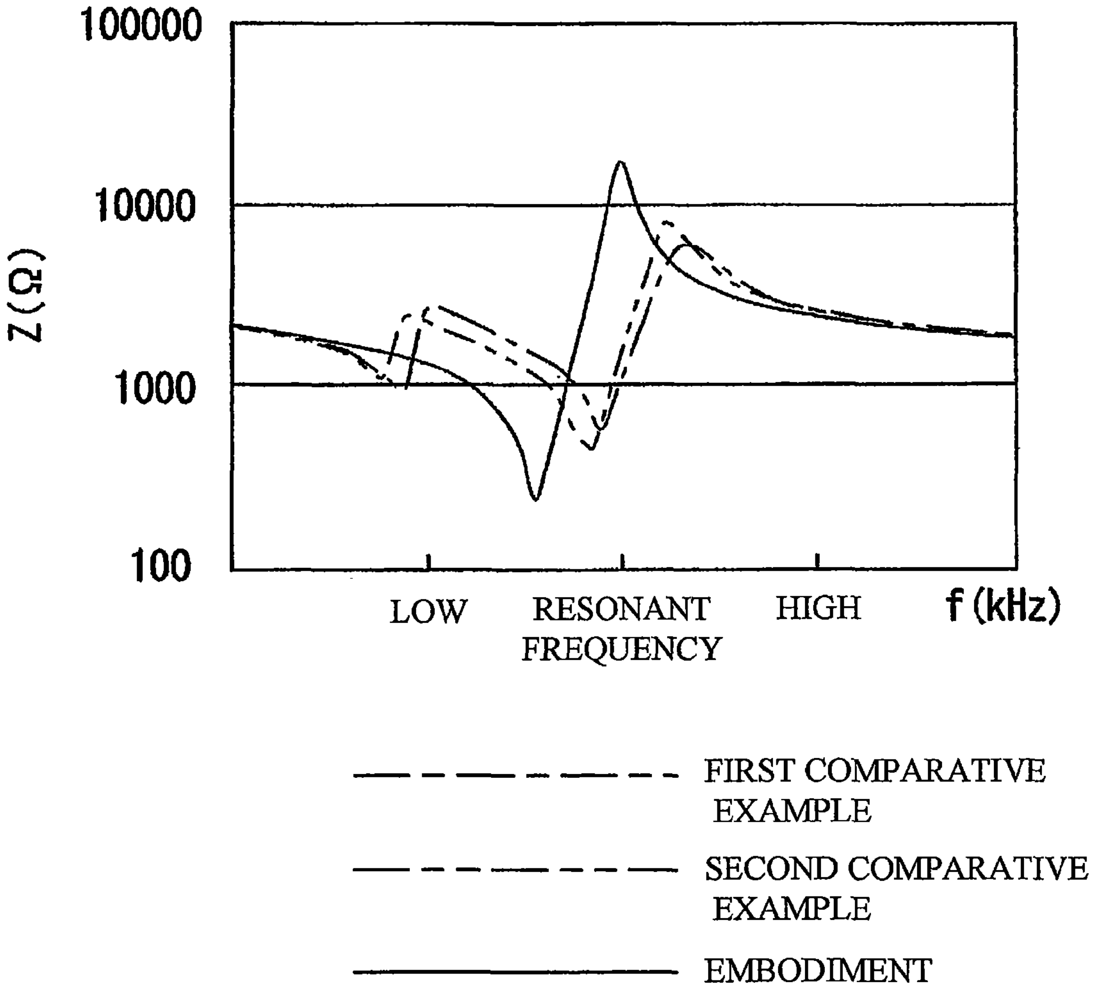
FIG. 6 is an explanatory diagram for a result of a test.

Regarding this effect, FIG. 6 shows a test result for a vibration characteristic using three kinds of piezoelectric sensors. First of all, first and second comparative examples (indicated by a single dashed line and a double dashed line in FIG. 6) had respective mounts which had cylindrical ribs and bonding portions, and which supported respective transducers in a complete plane by plane contact manner. An upper peak appeared at the lower range than the resonant frequency (the left to the resonant frequency in FIG. 6), and a resonant resistance Z (Ω) was high.

It can be estimated that the mount supported the transducer in a complete plane by plane contact manner, which disturbed the transducer to vibrate, and thus spurious vibration was generated. Moreover, according to the first and second comparative examples, no upper peak appeared at the resonant frequency, but an upper peak appeared at a slightly higher range than the resonant frequency (the right to the resonant frequency). It is thought that a peak to be originally generated relative to the resonant frequency was shifted due to the peak appeared at the above-explained lower range.

Furthermore, according to the first comparative example indicated by the single dashed line, the upper peak appeared at the slightly higher peak was smaller than the peak of the second comparative example at the same position and indicated by the double dashed line. It can be expected that such a smaller peak was affected by an upper peak of the first comparative example at the lower range which became larger than the peak of the second comparative example at the same position.

In contrast, according to the piezoelectric sensor 1 of this embodiment, the mount 42 has the supports 46 and the notches 50, and the supports 46 contact the transducer 2 in a partially plane by plane contact manner to support the transducer 2. Conversely, the notches 50 are provided near the nodes of vibration of the transducer 2 like the supports 46 but do not contact the transducer 2 and do not support the transducer 2.

That is, among the cylindrical ribs, portions other than ones left as the supports 46 are eliminated, and as shown by a continuous line in FIG. 6, no upper peak appears at the lower range unlike the first and second comparative examples. Moreover, according to this embodiment, an upper peak appears at the resonant frequency. That is, the mount 42 does not disturb vibration of the transducer 2, and thus spurious vibration is reduced.

Furthermore, according to this embodiment that makes the contact area reduced between the mount 42 and the transducer 2, a range from a lower peak to an upper peak appeared at the resonant frequency is widespread in comparison with respective ranges of the first and second comparative examples from a lower peak to an upper peak. That is, the piezoelectric sensor 1 is efficient which accomplishes good vibration and which makes a range of the resonant resistance Z wide.

Moreover, the supports 46 are disposed at the three locations at a substantially equal interval as viewed in the circumferential direction of the mount 42 formed in a substantially columnar shape. The layout with an equal interval does not contribute to a reduction of spurious vibration, but such a layout with an equal interval accomplishes stable support to the transducer 2 even if the contact area with the transducer 2 is reduced. Furthermore, when the supports 46 are provided at an equal interval, it becomes easy to provide the supports 46 on the mount 42 in comparison with a case in which the supports 46 are simply provided at three locations, thereby reducing the production cost of the piezoelectric sensor 1.

Still further, to support the transducer 2 near the nodes of vibration, a bond can be also applied to the notches 50, and thus the surface area of the bonding portions 52 can be increased in comparison with a case in which the bonding portions are provided inwardly of the supports 46 as viewed in the radial direction of the mount 42. Hence, the transducer 2 can be bonded to the mount 42 near the nodes of vibration even if the contact area between the mount 42 and the transducer 2 is reduced.

In the case of the supports 46 that contact the transducer 2 in a partial plane by plane contact manner, when respective tip surfaces are formed to be flat, the disturb by the mount 42 of vibration of the transducer 2 is further suppressed, which contributes improvement of the vibration performance of the transducer 2. Moreover, according to this embodiment, the piezoelectric sensor 1 further has the case 40 that includes the leads 16 and 26 drawn from the transducer 2 and accomplishing an electrical continuity between the transducer 2 and the terminals 80 and 82 connected to a circuit board, and the mount 42 on the top face 44 opposite to the lower face 54 holding the terminals 80 and 82. The lower face 54 is provided with the spacers 58 and 60 for ensuring a space between the lower face 54 and the circuit board. Hence, it is possible to suppress a transmission of vibration of the case 40 to the circuit board, and a damage to the circuit board and the case 40 by solders.

OTHER EMBODIMENTS

The present invention is not limited to the above-explained embodiment, and can be changed and modified in various forms without departing from the scope and spirit of the present invention set forth in claims. For example, the piezoelectric sensor of the above-explained embodiment is configured to transmit and receive ultrasound, but the piezoelectric sensor of the present invention may have either one of transmission and reception functions only. Moreover, the piezoelectric sensor of the present invention can be built in various modules that operate based on presence/absence of an object and a detection result of a distance thereto in addition to the detector of the automatic door.

More specifically, an example module that uses a detection result of a distance to an object is a liquid level gauge, an automotive back sonar, a distance gauge, or an automatic switch for traffic lights. Moreover, example modules that use presence/absence of an object are an intruder alarm device and an automatic lighting switch. This is because a distance to an object and presence/absence thereof can be detected through a measurement of a reflection time of ultrasound and an observation of the number of vibrations (Doppler effect).

Furthermore, the above-explained embodiment is an optimized example in consideration of the production of the piezoelectric sensor 1. More specifically, according to the above-explained embodiment, the explanation was given of a case in which the mount 42 and the transducer 2 contact in a partially plane by plane contact manner. However, the present invention focuses on reduction of the contact area with the transducer 2, not a large contact area by cylindrical ribs and bonding portions of the prior art. In other words, in addition to a structure in which the mount 42 and the transducer 2 contact in a partially plane by plane contact manner, as long as the mount 42 and the transducer 2 contact at plural locations in a point by point contact manner, line by line contact manner, or the contact area with the transducer 2 is reduced, the transducer 2 may be supported by a combination of such structures.

Still further, according to the above-explained embodiment, the ribs 46 are provided at the three locations, but the present invention is not limited to the structure of this embodiment. The equilibrium of the transducer can be maintained as long as the ribs 46 are provide at greater than or equal to two locations. In such a case, like the above-explained embodiment, an advantage of reducing spurious vibration of the transducer can be obtained.

What is claimed is:

1. A piezoelectric sensor comprising:

a transducer which includes a piezoelectric body and a vibration plate and which transmits/receives ultrasound;

a mount with a top face to operatively support the transducer, the top face including a plurality of supports that are spaced from each other to provide relatively small contact area support surfaces that contact and position the piezoelectric body; and a plurality of individual spaced bonding portions connecting the piezoelectric body to the mount at positions offset from a center of the transducer so that a node of mechanical vibration will have an amplitude of vibration approaching zero and some of the plurality of support members are positioned adjacent some of the individual spaced bonding portions wherein any spurious vibrations from the transducer are reduced.

2. The piezoelectric sensor according to claim 1, wherein the mount further comprises retract portions which are provided side by side to respective supports near nodes of mechanical vibration and which are distant from the transducer so as not to support the transducer.

3. The piezoelectric sensor according to claim 1, wherein the supports are disposed at three locations along a circumference of the mount at a substantially equal interval.

4. The piezoelectric sensor according to claim 1, wherein the supports each have a tip surface which is formed in a flat shape and which contacts the transducer in a plane by plane contact manner.

5. The piezoelectric sensor according to claim 1, further comprising:

a lead which is drawn from the transducer and which has an electrical continuity between the transducer and a terminal connected to a circuit board; and a case that has the mount on a surface opposite to a surface holding the terminal, and of which outer peripheral portion is a peripheral wall, wherein the surface holding the terminal is provided with a spacer that ensures a space between the surface holding the terminal and the circuit board.

6. A piezoelectric sensor comprising:

a transducer which includes a piezoelectric body and a vibration plate, the transducer emits ultrasound when driven to provide mechanical vibration of the vibration plate to generate the ultrasound;

a case having a peripheral wall with an upper opening that extends around a portion of the transducer and a mount with a top face to operatively support the transducer within the case, the top face includes a plurality of supports that are spaced from each other to provide relatively small contact area support surfaces that contact and position the piezoelectric body within the case; and a plurality of individual spaced bonding portions connect the piezoelectric body to the mount at positions offset from a center of the transducer so that a node of mechanical vibration will have an amplitude of vibration approaching zero and some of the plurality of support members are positioned adjacent some of the individual spaced bonding portions wherein any spurious vibrations from the transducer are reduced.

7. The piezoelectric sensor according to claim 6 wherein the support members include individual ribs extending from the mount top face to contact the transducer near nodes of mechanical vibration in one of a point by point, line by line and a partial plane by partial plane contact manner to support the transducer.

8. The piezoelectric sensor according to claim 7 wherein the peripheral wall is divided by side openings.

9. The piezoelectric sensor according to claim 6 where the case and mount are formed integrally from a plastic resin.

10. The piezoelectric sensor according to claim 6 wherein a metal horn is disposed on a front face of the vibration plate within the peripheral wall of the case and a circuit board is mounted below the case to drive the transducer.

11. The piezoelectric sensor according to claim 10 wherein the mount includes a peripheral wire lead receiving opening to enable a wire connection from the circuit board to the transducer.

12. The piezoelectric sensor according to claim 10 wherein a pair of horn openings in the peripheral wall are aligned with a pair of peripheral wire lead receiving openings to enable wire connection from the circuit board to the transducer.

13. The piezoelectric sensor according to claim 6 wherein retract portions are provided in the mount adjacent the supports to further distance parts of the mount face from the transducer.

14. The piezoelectric sensor according to claim 13 wherein a central circular retract portion is surrounded by peripheral retract portions.

* * * * *